(12) United States Patent
Ginter et al.

(10) Patent No.: US 6,426,461 B1
(45) Date of Patent: Jul. 30, 2002

(54) ENCLOSURE FOR ELECTRONIC COMPONENTS

(75) Inventors: Mark Allan Ginter, Russiaville; Earl James Lowrance, Bunker Hill, both of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/666,749

(22) Filed: Sep. 21, 2000

(51) Int. Cl.[7] ................................................ H05K 5/06
(52) U.S. Cl. ..................... 174/52.3; 174/52.4; 174/50.5; 257/704
(58) Field of Search ............................... 174/52.1, 52.3, 174/52.4, 50.5, 50.51, 50.54; 257/678, 701, 702, 704, 710, 713, 731, 732, 733; 361/748, 752, 760, 763, 764

(56) References Cited

U.S. PATENT DOCUMENTS

| 4,410,905 A | * | 10/1983 | Grabbe ......................... 357/80 |
| 4,594,770 A | * | 6/1986 | Butt .............................. 29/588 |
| 5,276,414 A | * | 1/1994 | Fujimoto et al. ............ 333/246 |
| 5,610,431 A | * | 3/1997 | Martin ......................... 257/415 |
| 5,704,117 A | * | 1/1998 | Mok et al. .................... 29/841 |

* cited by examiner

Primary Examiner—Dean A. Reichard
Assistant Examiner—Carmelo Oliva
(74) Attorney, Agent, or Firm—Jimmy L. Funke

(57) ABSTRACT

In one embodiment of the invention, an enclosure for an electronic component and a plurality of lead traces that connect the electronic component to a circuit board is used. The enclosure has a flexible diaphragm on one side and a sealing flange supporting said diaphragm and providing an attaching surface to fix the enclosure to the circuit board. This enclosure surrounds the electronic component and creates a barrier resistant to the external environment.

16 Claims, 2 Drawing Sheets

ENCLOSURE FOR ELECTRONIC COMPONENTS

TECHNICAL FIELD

The present invention relates generally to electronic component enclosures, and more particularly, to an enclosure for making a localized portion of a circuit board resistant to the surrounding environment.

BACKGROUND ART

It is well known in the electronic field that circuit boards may be sealed with potting materials or epoxy to secure the components to the circuit board. It is also well known that moisture may damage electronic components.

Sealing a circuit board with epoxy or potting materials or allowing moisture to contact electronic components has several shortcomings. Often when epoxy or potting materials are applied to a circuit board having an electronic component attached by lead traces, the lead traces tend to break. That is, when a potting agent or epoxy is applied, the electronic component is surrounded by the sealant, and, upon the sealant drying or upon exposure to temperature extremes, the electronic component has a tendency to be lifted from the circuit board. This lifting from the circuit board can cause the lead traces to break and result in a discontinuity in the circuit. Moreover, moisture has a tendency to cause electronic components to short-circuit.

Circuit board manufacturers have not substantially addressed the problem of component lift during and after sealing or moisture accumulation on electronic components. This has made it apparent that a technique for protecting localized electronic components on a circuit board from their environment is needed. The technique should be resistant to the external environment. The present invention is directed to this end.

SUMMARY OF THE INVENTION

It is, therefore, an object of the invention to provide reliable protection for localized electronic components on a circuit board from their environment.

In one embodiment of the invention, an enclosure for an electronic component having a plurality of lead traces that connect the electronic component to a circuit board is used. The enclosure includes a flexible diaphragm on one side and a sealing flange which is attached to the circuit board to surround the electronic component.

In a further embodiment of the invention, the enclosure is placed over at least a portion of one of the plurality of lead traces and the electronic component. The enclosure is then attached to the circuit board over the electronic component such that the electronic component is surrounded. Resultantly, a vacuum seal that is resistant to the surrounding environment is created.

The present invention thus achieves a reliable protection for localized electronic components on a circuit board. The present invention is advantageous in that it insures an environmentally resistive seal by creating a sealed environment between the electronic component on the circuit board and an enclosure for that electronic component.

Additional advantages and features of the present invention will become apparent from the description that follows and may be realized by the instrumentalities and combinations particularly pointed out in the appended claims, taken in conjunction with the accompanying drawings.

BRIEF DESCRIPTION OF THE DRAWINGS

For a more complete understanding of the invention, there will now be described some embodiments thereof, given by way of example, reference being made to the accompanying drawings, in which.

DETAILED DESCRIPTION

The present invention is illustrated with respect to a localized electronic component protector system, particularly suited for the electronics field. However, the present invention is applicable to various other uses that may require localized component protection.

Figure 1:
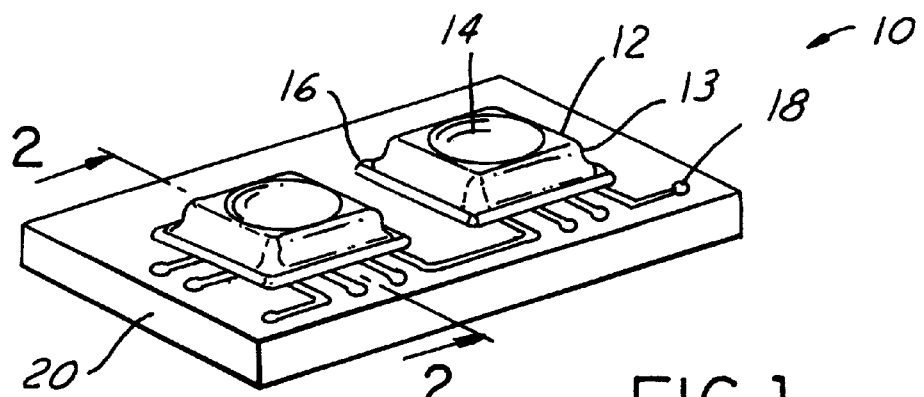
FIG. 1 is a perspective view that illustrates a localized electronic component protection system according to one embodiment of the present invention.
Figure 2:
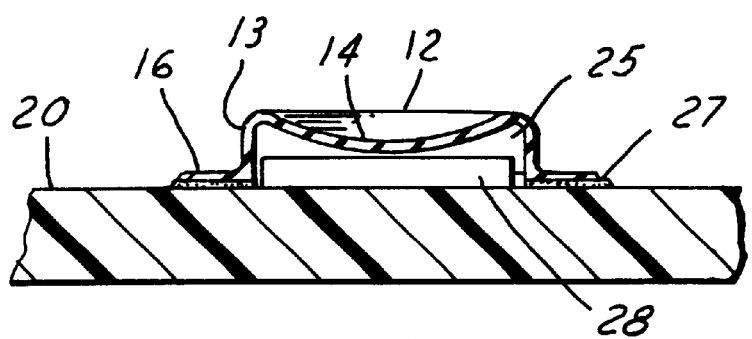
FIG. 2 is a sectional view of FIG. 1 along line 2—2.

Referring to FIGS. 1 and 2, a localized electronic component protector system 10 in accordance with one embodiment of the present invention is illustrated. The localized electronic component protector system 10 includes an enclosure 12 for an electronic component 28. The enclosure has two sides. One side is a flexible diaphragm 14 which may be concave or convex with respect to a circuit board 20. The other side contains a flange 16. Preferably, the flange 16 is connected to the diaphragm 14 by a walled perimeter 13.

One embodiment of the material that the enclosure 12 can be made of is moldable grade silicon rubber preferably having a hardness rating of approximately Shore A 40. The enclosure 12, in addition, may be attached by an adhesive 27 like Dow Corning 6265 Silicon-based adhesive. The moldable grade silicon rubber and the Dow Corning 6265 Silicon-based adhesive work well because they are both resistant to moisture, potting materials and other adhesives as desired.

Furthermore, an example of the electronic component 28 is an integrated circuit that requires attachment to a circuit board by a plurality of lead traces 18 where those lead traces may be interfered with by potting materials, adhesives used to seal the circuit board 20 or moisture. However, the system 10 will protect various other electronic components, and the system will also protect multiple components under a single enclosure 12.

To actuate the electronic component protector system 10, adhesive is applied to the flange 16 and the enclosure 12 is placed over the electronic component 28. Alternately, the adhesive 27 may be applied directly to the circuit board 20 around the electronic component 28 to be protected and the plurality of lead traces 18 by tracing the perimeter of the flange 16 of the enclosure 12 prior to the placement of the enclosure 12 on the circuit board 20. Preferably, following application of adhesive 27 to the flange 16 or the circuit board 20, the enclosure 12 is placed on the circuit board 20. Thus an internal environment 25 is created which encloses the electronic component 28 and a portion of the plurality of lead traces 18 and is surrounded by the enclosure 12 that is resistant to the external environment. An example of how the enclosure 12 is attached is the compression of the diaphragm 14 to expel air from the internal environment 25 between the component 28 and the enclosure 12. Thereby, a vacuum is created which aids in securing the enclosure 12. Another example of attachment of the enclosure 12 is by creating a vacuum around the enclosure 12 on the circuit board 20. This suctions the enclosure 12 onto the circuit board 20.

Figures 3, 4:
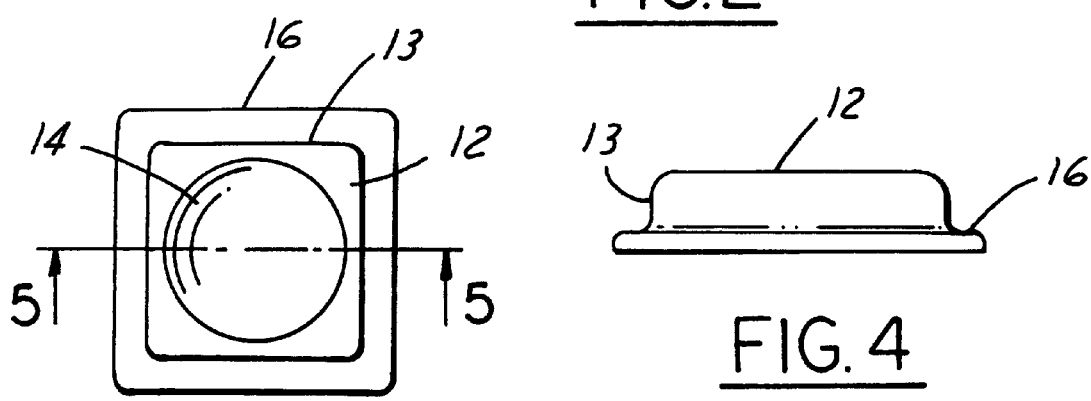
FIG. 3 is a top view of an electronic component enclosure according to one embodiment of the present invention.
FIG. 4 is a side view of FIG. 3.

Referring to FIG. 3, a top view of an electronic component enclosure 12 in accordance with one embodiment of the present invention is illustrated. Here, the enclosure 12 is represented as approximately square with a circular diaphragm 14, but other possible options for the enclosure 12 design will be discussed later.

Referring to FIG. 4, a side view of the enclosure 12 of FIG. 3 is illustrated. FIG. 4 demonstrates that the flange 16 may be extended past the sides 13 of the enclosure 12 for a wide flange 16 for attachment of the enclosure 12 to the circuit board 20. The wider flange 16 also provides a surface for the adhesive 27 to insure an adequate seal around the component 28.

Figure 5:
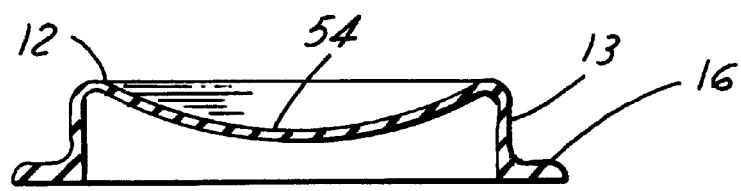
FIG. 5 is a sectional view of FIG. 3 along line 5—5.
Figure 6:
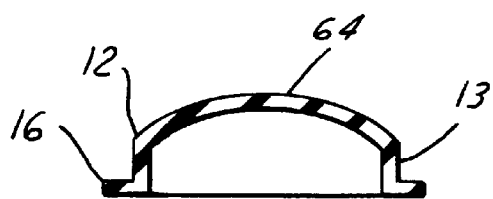
FIG. 6 is a sectional view of FIG. 3 along line 5—5 in accordance with another embodiment of the present invention.

Referring to FIG. 5, a sectional view of FIG. 3 along line 5—5 is illustrated. An example of the diaphragm 14 is shown here to be concave 54. However, the diaphragm 14 may also be convex 64 as shown in FIG. 6, which is an alternate sectional view of FIG. 3 along line 5—5.

Figure 7:
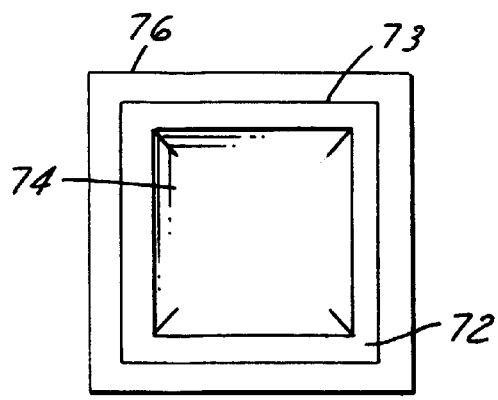
FIG. 7 is a top view of an electronic component enclosure in accordance with another embodiment of the present invention.
Figure 8:
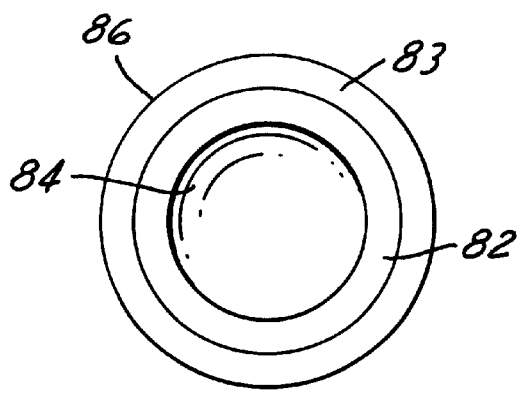
FIG. 8 is a top view of an electronic component enclosure in accordance with another embodiment of the present invention.
Figure 9:
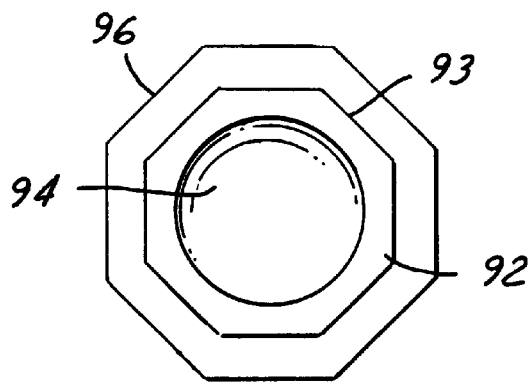
FIG. 9 is a top view of an electronic component enclosure in accordance with another embodiment of the present invention.
Figure 10:
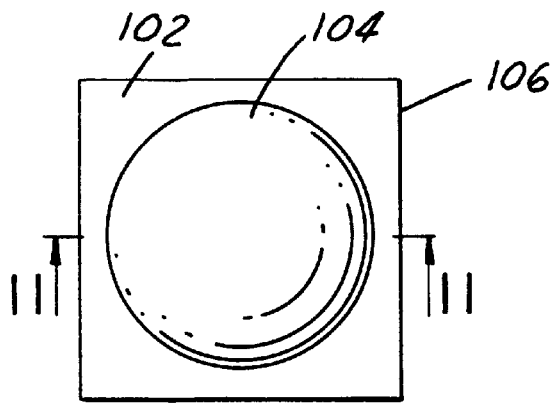
FIG. 10 is a top view of an electronic component enclosure in accordance with another embodiment of the present invention.
Figure 11:
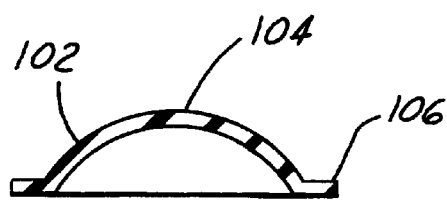
FIG. 11 is a sectional view of FIG. 10 along line 11—11.

FIGS. 7, 8, 9, 10, and 11 illustrate alternate embodiments of the present invention. For example, as shown in FIG. 7, the enclosure 72 is square with a square diaphragm 74, square flange 76 and square sides 73. Moreover, as shown in FIG. 8, the enclosure 82 is circular with a circular diaphragm 84, circular sides 83 and a circular flange 86. Furthermore, as shown in FIG. 9, the enclosure 92 has an octagonal flange 96 and sides 93 and a circular diaphragm 94. Additionally, as shown in FIG. 10, the enclosure 102 is an embodiment without sides and merely as a diaphragm 104 and a flange 106. FIG. 10 is further illustrated in FIG. 11, which is a sectional view of FIG. 10 along line 11—11.

From the foregoing, it can be seen that there has been brought to the art a new localized electronic component protector system 10. It is to be understood that the preceding description of the preferred embodiment is merely illustrative of some of the many specific embodiments that represent applications of the principles of the present invention. Numerous and other arrangements would be evident to those skilled in the art without departing from the scope of the invention as defined by the following claims:

What is claimed is:

1. An enclosure for an electronic component connected to a circuit board by a plurality of lead traces, the enclosure comprising:
   a flexible diaphragm;
   a sealing flange forming a perimeter surrounding said diaphragm, said sealing flange supporting said diaphragm and providing an attaching surface to fix the enclosure to the circuit board;
   whereby attaching the enclosure to the circuit board at said flange creates a barrier resistant to the surrounding environment.

2. The enclosure as recited in claim 1, wherein the enclosure is silicon rubber.

3. The enclosure as recited in claim 1, wherein the enclosure has a walled perimeter extending between said flange and said diaphragm.

4. The enclosure as recited in claim 1, wherein said diaphragm is concave with respect to the circuit board.

5. The enclosure as recited in claim 1, wherein said diaphragm is convex with respect to the circuit board.

6. A method for protecting an electronic component attached to a circuit board by a plurality of lead traces comprising the steps of:
   placing an enclosure over at least a portion of one of the plurality of lead traces and the electronic component such that the electronic component and the portion of the plurality of lead traces are surrounded by said enclosure, said enclosure having a flexible diaphragm portion located over the electronic component; and
   attaching the enclosure to the circuit board over the electronic component; thereby creating a vacuum seal that is resistant to the surrounding environment.

7. The method for protecting the electronic component as recited in claim 6, wherein the step of placing includes the step of compressing said enclosure over the portion of the plurality of lead traces and the electronic component.

8. The method for protecting the electronic component as recited in claim 6, wherein said enclosure creates an internal environment between said enclosure and the electronic component.

9. The method for protecting the electronic component as recited in claim 6, wherein the step of placing includes the step of attaching said enclosure to said circuit board fully surrounding the electronic component.

10. The method for protecting the electronic component as recited in claim 6, which the step of attaching includes the step of applying adhesive to a flange.

11. The method for protecting the electronic component as recited in claim 6, wherein the step of attaching includes applying adhesive to the circuit board.

12. The method for protecting the electronic component as recited in claim 6, wherein the step of attaching includes the step of drawing a vacuum around the enclosure to seal it on to the circuit board.

13. A system for protecting an electronic component attached to a circuit board by a plurality of lead traces comprising:
   an enclosure with a flange that is connected to the circuit board and surrounds the electronic component and a portion of the plurality of lead traces, said enclosure having a flexible diaphragm positioned over the electronic component;
   said enclosure adhered to the circuit board at said flange of said enclosure.

14. The system for protecting an electronic component as recited in claim 13, wherein said enclosure adhered to the circuit board includes materials that are resistant to potting materials.

15. The system for protecting an electronic component as recited in claim 13, wherein said enclosure adhered to the circuit board includes materials that are resistant to adhesives.

16. The system for protecting an electronic component as recited in claim 13, wherein said enclosure adhered to the circuit board includes materials that are resistant to moisture.

* * * * *